(12) United States Patent
Fritz et al.

(10) Patent No.: US 8,359,503 B2
(45) Date of Patent: Jan. 22, 2013

(54) METHOD AND SYSTEM FOR GENERATING AN INTEGRATED CIRCUIT CHIP FACILITY WAVEFORM FROM A SERIES OF CHIP SNAPSHOTS

(75) Inventors: Rolf Fritz, Waldenbuch (DE); Andreas Koenig, Leonberg (DE); Christopher Smith, Tamm (DE); Manfred Walz, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 1163 days.

(21) Appl. No.: 12/211,129

(22) Filed: Sep. 16, 2008

(65) Prior Publication Data

US 2010/0070232 A1 Mar. 18, 2010

(51) Int. Cl.
*G06F 11/00* (2006.01)

(52) U.S. Cl. ........................................ 714/731

(58) Field of Classification Search ............... 714/731; 702/124; 327/100
See application file for complete search history.

(56) References Cited

U.S. PATENT DOCUMENTS

2004/0250150 A1* 12/2004 Swoboda et al. ............. 713/330
2007/0074016 A1 3/2007 Alpers et al.

* cited by examiner

*Primary Examiner* — Scott Baderman
*Assistant Examiner* — Yair Leibovich
(74) *Attorney, Agent, or Firm* — Schmeiser, Olsen & Watts; Thomas E. Tyson

(57) ABSTRACT

Methods and corresponding test systems for generating a chip facility waveform from a series of chip snapshots. The methods including, (i) testing an integrated chip multiple times, each time increasing a clockstop delay delaying a clockstop generated by triggered error condition each time determining the state of state holding elements of the integrated circuit and (ii) testing an integrated circuit chip one time to generate a error condition and determining multiple times the states of state holding elements of the integrated circuit based on previous states of the state holding elements.

24 Claims, 5 Drawing Sheets

METHOD AND SYSTEM FOR GENERATING AN INTEGRATED CIRCUIT CHIP FACILITY WAVEFORM FROM A SERIES OF CHIP SNAPSHOTS

FIELD OF THE INVENTION

The present invention relates to the field of error management in integrated circuit chip technology; more specifically, it relates a method and system for generating a chip facility waveform from a series of chip snapshots.

BACKGROUND OF THE INVENTION

Complex integrated circuit chips can experience a type error conditions that is data dependent and generates a clock-stop condition making it difficult to determine the origin of the error condition. Therefore, there is a need to mitigate the deficiencies and limitations described hereinabove.

SUMMARY OF THE INVENTION

A first aspect of the present invention is a method, comprising: (a) selecting a set of state holding elements of an integrated circuit; (b) configuring a clockstop request delay to an initial number of clock cycles; (c) generating an error condition in the integrated circuit chip; (d) generating a clockstop request in response to the error condition; (e) delaying the clockstop request by a number of clock cycles equal to the clockstop request delay; after (e), (f) reading out a state of each state holding element of the set of state holding elements; after (f), (g) incrementing the clockstop request delay by a fixed number of clock cycles; and after (g), (h) repeating steps (c) through (f) a predetermined number of times or until an instruction to stop.

A second aspect of the present invention is a test system including a computer comprising a processor, an address/data bus coupled to the processor, and a computer-readable memory unit coupled to communicate with the processor, the memory unit containing instructions that when executed by the processor implement a method for generating a chip facility waveform, the method comprising the computer implemented steps of: (a) selecting a set of state holding elements of an integrated circuit; (b) configuring a clockstop request delay to an initial number of clock cycles; (c) generating an error condition in the integrated circuit chip; (d) generating a clockstop request in response to the error condition; (e) delaying the clockstop request by a number of clock cycles equal to the clockstop request delay; after (e), (f) reading out a state of each state holding element of the set of state holding elements; after (f), (g) incrementing the clockstop request delay by a fixed number of clock cycles; and after (g), (h) repeating steps (c) through (f) a predetermined number of times or until an instruction to stop.

A third aspect of the present invention is a method comprising: (a) selecting a set of state holding elements of an integrated circuit; (b) generating an error condition in the integrated circuit chip; (c) generating and executing a clockstop request in response to the error condition; after (c), (d) generating a snapshot of actual states of each of the state holding elements of the set of state holding elements; (e) determining next previous states of each state holding element of the set of state holding elements based on respective states of each state holding element of the set of state holding element of a last generated snapshot and based on a description of circuit elements of the integrated circuit chip and interconnections between the circuit elements; after (e), (f) generating a snapshot of the next previous states of each state holding element of the set of state holding elements; and after (f), (g) repeating steps (e) and (f) a predetermined number of times or until an instruction to stop.

A fourth aspect of the present invention is a test system including a computer comprising a processor, an address/data bus coupled to the processor, and a computer-readable memory unit coupled to communicate with the processor, the memory unit containing instructions that when executed by the processor implement a method for generating a chip facility waveform, the method comprising the computer implemented steps of: (a) selecting a set of state holding elements of an integrated circuit; (b) generating an error condition in the integrated circuit chip; (c) generating and executing a clockstop request in response to the error condition; after (c), (d) generating a snapshot of actual states of each of the state holding elements of the set of state holding elements; (e) determining next previous states of each state holding element of the set of state holding elements based on respective states of each state holding element of the set of state holding element of a last generated snapshot and based on a description of circuit elements of the integrated circuit chip and interconnections between the circuit elements; after (e), (f) generating a snapshot of the next previous states of each state holding element of the set of state holding elements; and after (f), (g) repeating steps (e) and (f) a predetermined number of times or until an instruction to stop.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A clock signal is defined as a repeating pulsed signal and a clock cycle is defined at the time between adjacent rising edges of the pulsed signal. A state holding element is defined as an element that may be in a logical zero state or a logical one state. Examples of state holding elements include but are not limited to latches and memory elements. Examples of memory elements include but are not limited to dynamic random access memory cells, and static random access memory cells.

Figure 1:
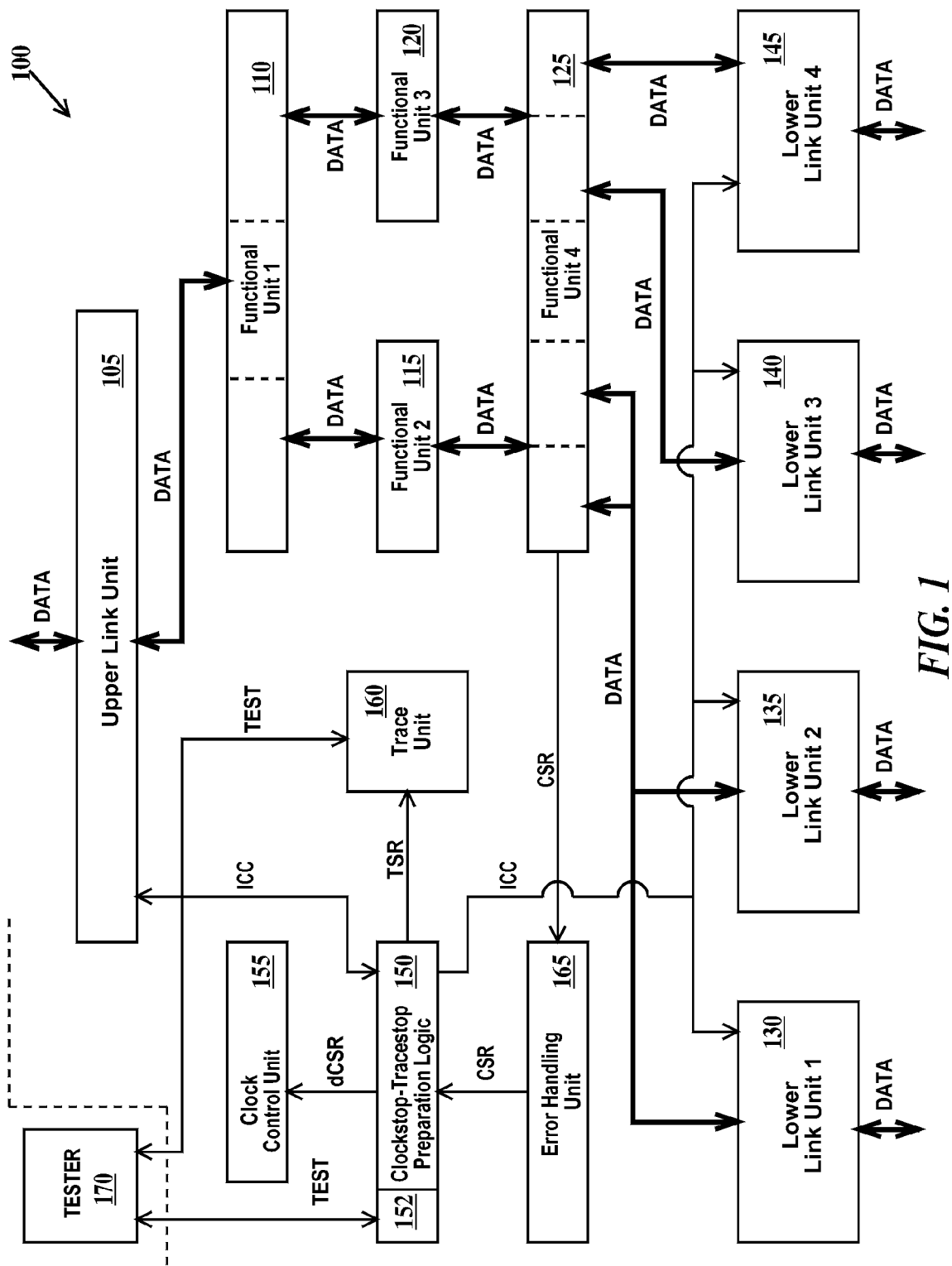
FIG. 1 illustrates basic components of an exemplary integrated circuit chip to which embodiments of the present invention may be applied.

FIG. 1 illustrates basic components of an integrated circuit chip to which embodiments of the present invention may be applied. The exemplary integrated circuit chip of FIG. 1 is an I/O subsystem integrated circuit chip 100 that performs protocol conversions and checking as well as fan-out functionality in a computer network environment. Chip 100 includes a higher link unit 105 connected to a root complex of functional units 110, 115, 120 and 125 arranged in a logical tree (the arrangement is exemplary of any cone of logic or arrangement of functional circuits), and lower link units 130, 135, 140 and 145. In one example, upper link unit 105 and lower links units 130, 135, 140 and 145 support a same link protocol. Chip 100 also includes a clockstop-trace stop preparation logic (CTPL) 150, which includes a clock cycle counter 152, a clock control unit 155, a trace unit and an error-handling unit 165. Data paths (for transferring data packets) from higher link unit 105, through functional logic units 110, 115, 120 and 125 to lower link units 130, 135, 140, and 145 are labeled "DATA." Clockstop request paths are labeled "CSR", trace stop request paths are labeled TSR and inter-chip clockstop communications are labeled "ICC." CTPL 150 and trace unit 160 are linked to a tester 170 and initialization, control signals and data collected in trace unit 160 are passed between CTPL 150 and trace unit 160 and tester 170 by paths labeled "TEST."

In operation, when an error condition that is too severe to handled within functional unit 125 is detected by an internal error detection unit in functional unit 125, a clockstop request is generated which is transmitted to error handling unit 165. Error handling unit 165 generates a clockstop request, which is transmitted to CTPL 150 and delayed based on the contents of counter 152 before being transmitted to clock control unit 155 (as a delayed clockstop request), which will stop the functional chip clock (the clocks for higher link unit 105, functional units 110, 115, 120 and 125 and lower link units 130, 135, 140 and 145, but not non-functional clocks for the other components of chip 100. Clock cycle counter 152 is initialized (e.g., to 0) by tester 170 to an initial number of counts. After each clock cycle starting with a clock cycle on which a clockstop request is issued by functional circuit 125, clock cycle counter 152 is incremented (e.g., by 1 clock cycle). When clock cycle counter 152 reaches a predefined number clock cycles CTPL then passes the clockstop request as a delayed clockstop request to clock control unit 155. At this time CTPL 150 also can be setup to transmit a trace stop request to trace unit 160, which collects the current state of selected state holding elements of chip 100 and transmits the data to tester 170. The specific state holding elements from which data is collected is also determined during initialization. Alternatively, the chip may be designed to perform a "chip dump" which is a readout of the state of all the state holding elements (e.g., latches in scan chains) of the chip so only a chip dump command is required. Tester 170 also initializes chip 100 and sends test data into higher link unit 105 via the normal DATA path.

In one example CTPL 150 is implemented in hardware. In one example, CTPL 150 is implemented as a software application.

While an I/O subsystem chip has been used as an example circuit, the embodiments of the present invention may be applied to other integrated circuit chips such as processors and memory controllers] having a CTPL configured according to the operational requirements of those chips.

Figure 2:
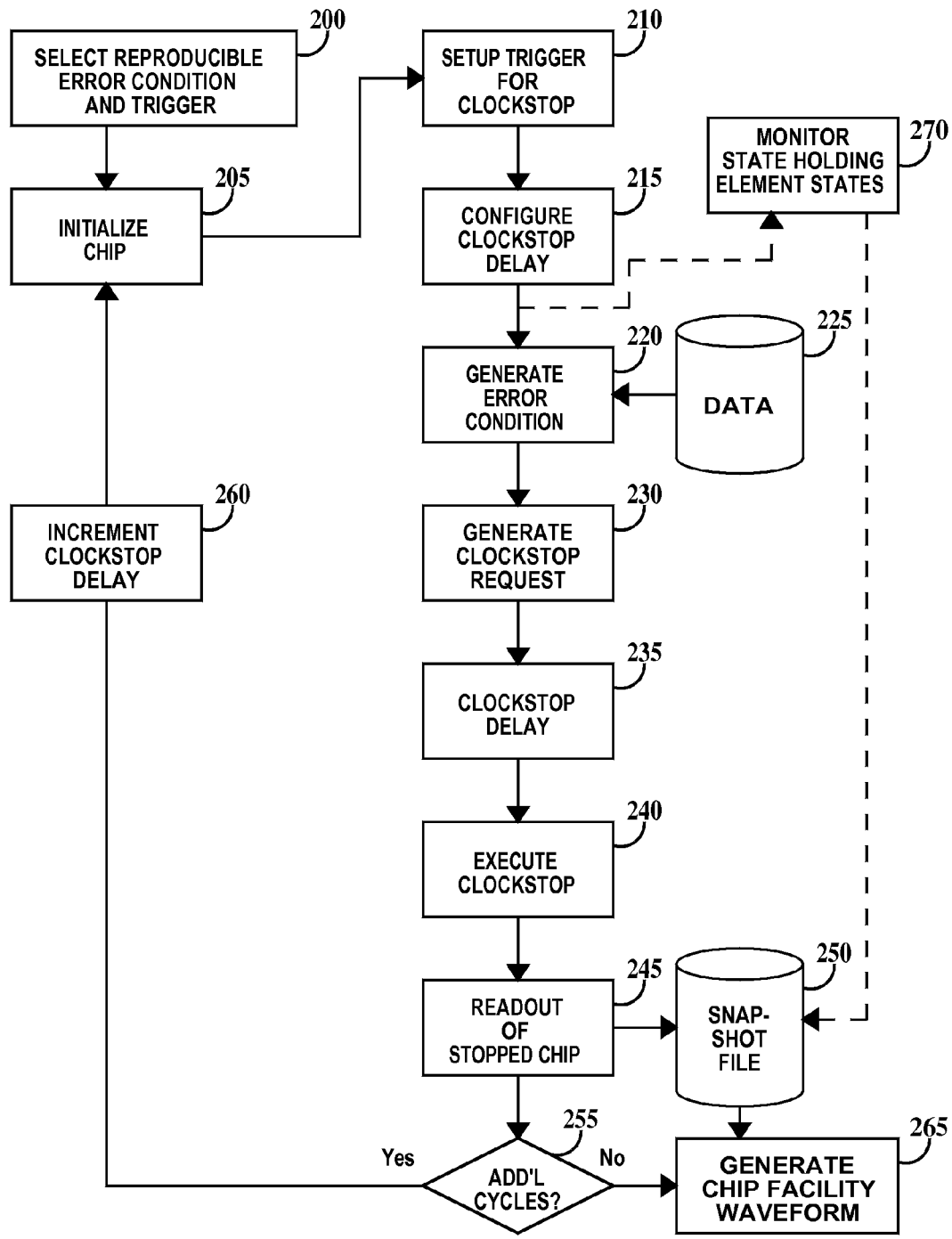
FIG. 2 is a flowchart of a method of generating a chip facility waveform according to a first embodiment of the present invention.

FIG. 2 is a flowchart of a method of generating a chip facility waveform according to a first embodiment of the present invention. In step 200, for a particular integrated circuit chip, a reproducible error condition that generates a clockstop request and a trigger (e.g., in the example of FIG. 1, processing a particular data packet) for that error condition are selected. In step, 205 the chip to be tested is initialized. Initialization includes "normal" initialization tasks such as initialing clocks, routings, and loading data (other than the trigger data). Initialization can also include selecting which state holding elements will be read out after a clockstop request is executed. Again, alternatively, the chip may be designed to perform a "chip dump" which is a readout of the state of all the state holding elements (e.g., latches in scan chains) of the chip so only a chip dump command is required. In step 210, the chip is configured to generate a clockstop request when the error condition occurs. In step 215, a clockstop request delay is configured to either an initial number of clock cycles the first time through step 215 or to an incremented number of clock cycles on subsequent times through step 215. In step 220, the error condition is generated, for example, by inputting trigger data (e.g., from a data file 225) to the chip that is known to cause the error condition. In the example of chip 100 of FIG. 1, this would be a data packet introduced into higher link unit 105 (see FIG. 1). As processing of the trigger data by the chip progresses at some point the trigger data causes a clockstop request in step 230. In step 235, the clockstop is delayed by the initialized number of clock cycles and in step 240, the clockstop is executed stopping further processing of data. In step 245, the data from the selected state holding elements along with the clock cycle number since the start of processing of the trigger data is readout and stored (e.g., in a snapshot file 250). The selected state holding elements may include all (if a chip dump is performed) or a subset of the state holding elements (selected during initialization step 205) of the chip. In step 255, it is determined if additional snapshots are required.

If in step 255, additional snapshots are required the method proceeds to step 260 where the clockstop request delay is incremented by a fixed number of clock cycles and then back to step 205 to start another loop. This looping is repeated as many times as required to build up the snapshots required to generate a chip facility waveform, each loop generating a snapshot at a later clock cycle then the previous loop. The only difference between loops is the delay in the execution of the clockstop request becoming progressively longer.

If in step 255, no additional snapshots are required then in step 265 a chip facility waveform is generated from the snapshots stored in snapshot file 250. Alternatively, step 265 may be executed after each loop is completed and the chip facility waveform displayed as an animation of a group of snapshots with the older snapshots dropping off left side of the display as new snapshots are added to the right side of the display. The number of loops can be pre-programmed into the tester or stopped by an operator observing the animation.

It should be appreciated that steps 205, 210, 215, 245, 255, 260 and 265 are performed by a tester connected to a physical chip under test and steps 220, 230, 235 and 240 are automatically performed by the chip. The tester includes a computer or is linked to a computer.

Because the clockstop may not occur for several clock cycles after introducing trigger data into the chip, the tester may be configured to readout snapshots of these earlier clock cycles by inserting optional step 270 between steps 215 and 220 and linking step 270 to file 250. Physically this capability may reside in trace unit 160 of FIG. 1 or within the tester itself.

Figure 3:
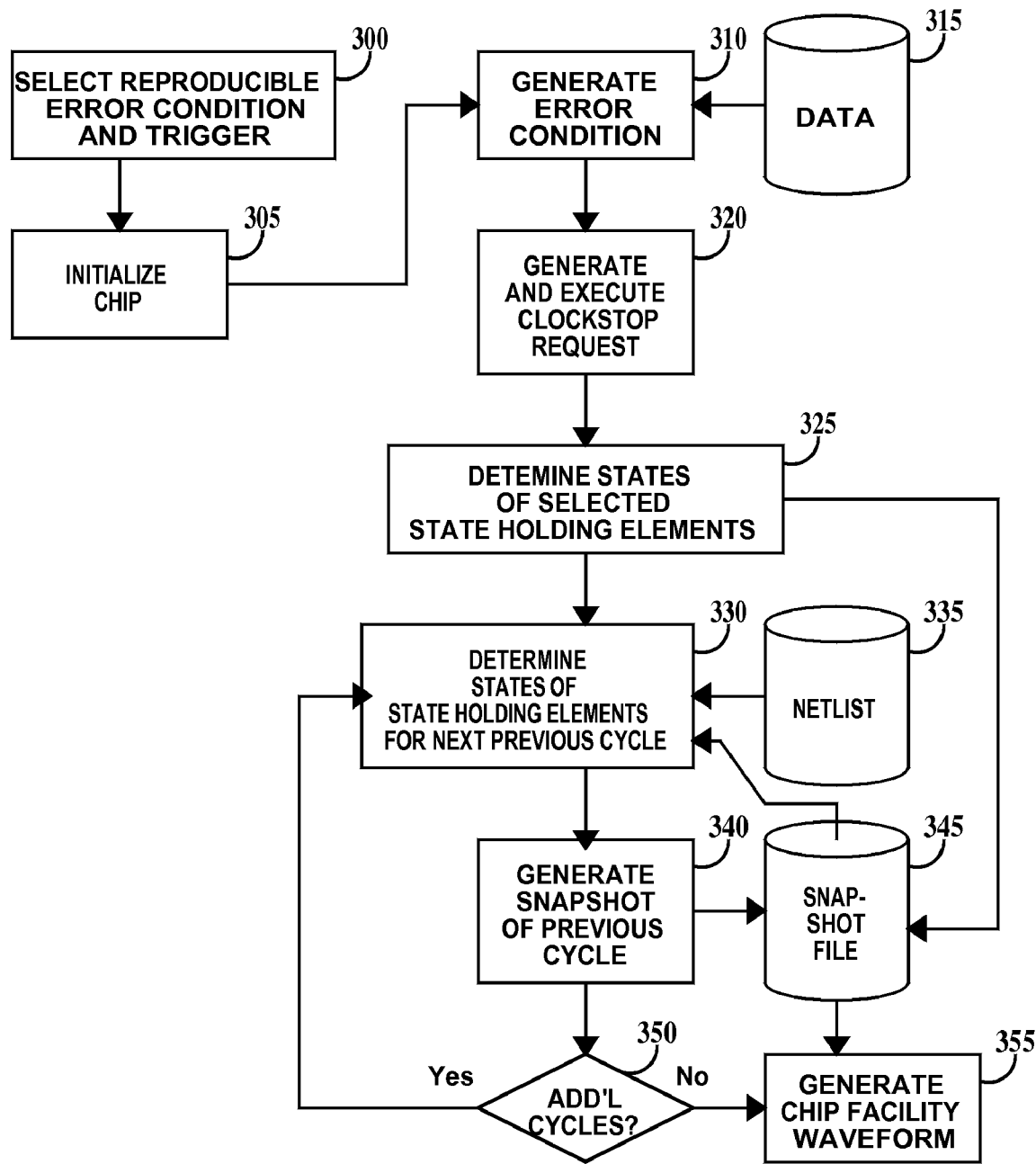
FIG. 3 is a flowchart of a method of generating a chip facility waveform according to a second embodiment of the present invention.

FIG. 3 is a flowchart of a method of generating a chip facility waveform according to a second embodiment of the present invention. In step 300, for a particular integrated circuit chip, a reproducible error condition that generates a clockstop request and a trigger (e.g., in the example of FIG. 1, processing a particular data packet) for that error condition are selected. In step, 305 the chip to be tested is initialized. Initialization includes "normal" initialization tasks such as initialing clocks, routings, and loading data (other than the trigger data). Initialization also includes selecting which state holding elements will be read out after a clockstop is executed. Again, alternatively, the chip may be designed to perform a "chip dump" which is a readout of the state of all the state holding elements (e.g., latches in scan chains) of the chip so only a chip dump command is required. In step 310, the error condition is generated, for example, by inputting trigger data (e.g., from a data file 315) to the chip that is known to cause a fail. In the example of chip 100 of FIG. 1, this would be a data packet introduced into higher link unit 105 (see FIG. 1). As processing of the trigger data by the chip progresses at some point the trigger data results in a clockstop request being generated and executed in step 320. In step 325, the actual states of the selected state holding elements are determined and stored with a corresponding clock cycle value as a snapshot.

It should be appreciated that steps 305 and 310 are performed by a tester connected to a physical chip under test and step 320 is automatically performed by the chip. Subsequent steps 330, 335, 340, 350 and 355 are performed using a simulator running on a computer that is linked to or part of the tester.

In a first time through step 330, the states of the state holding elements determined in step 325 are combined with circuit design information (e.g., from a netlist 335) to determine next previous states of the selected state holding elements. Thereafter, each time through step 330 the last determined states of the selected state holding elements, which are also the states of the last generated snapshot, are used to calculate next previous states of the selected state holding elements. The selected state holding elements may include all (if a chip dump is performed) or a subset of the state holding elements (selected during initialization step 305) of the chip. In step 340, the determined state holding element states along with the clock cycle associated with the determined state holding element states are stored in a snapshot file 345. In step 350, it is determined if additional snapshots are required.

Next previous states of state holding elements are defined as the state of the state holding elements one clock cycle before the clock cycle associated with the last generated snapshot. If the clock cycle of the first (and actual) snapshot is n, then the next previous states of the state holding elements occur in sequence at clock cycle n−1, n−2, n−3 etc. The n snapshot contains actual state holding element states. The n−1 snapshot contains calculated state holding element states based on the actual state holding element states of the n snapshot. The n−2 through n−x (where x is one less than the total number of snapshots) contain calculated state holding element states based on previously calculated state holding element states of the n−1 through x snapshots respectively.

A netlist is a data file describing circuit elements such as logic gates, state holding elements, registers, memory elements, to give a few examples, and interconnections between the elements. In the example of FIG. 1, the portion of the netlist of chip 100 of interest in step 330 is higher link unit 105, functional units 110, 115, 120 and 125 and lower link units 130, 135, 140 and 150. Other types of data files besides netlists, such as high level description language files (e.g., VHDL, verilog, SystemC) or any other suitable description of the circuit elements and interconnections between the circuit elements may be used.

If in step 350, additional snapshots are required the method loops back to step 330 where the next previous states of the selected state holding elements are calculated one clock cycle earlier than the clock cycle than the clock cycle to the last loop through step 330 using netlist 335 and the state holding element states of the previous snapshot. This looping is repeated as many times as required to build up the snapshots required to generate a chip facility waveform/chip facility waveform, each loop generating a snapshot at an earlier clock cycle. It should be understood that it may not be possible to determine a state of any given state holding element after several loops and provision should be made to include indications of "unknown" states in snapshots.

If in step 350, no additional cycles are required then in step 355 a chip facility waveform is generated from the snapshots stored in snapshot file 345. Alternatively, step 355 may be executed after each loop is completed and the chip facility waveform displayed as an animation of a group of snapshots with the older snapshots dropping left side of the display as new snapshots are added to the right side if the display. The number of loops can be pre-programmed into the simulator or stopped by an operator observing the animation. The looping may also be automatically terminated when the number of "unknown" states exceeds a predetermined threshold value (e.g., 50%).

Figure 4:
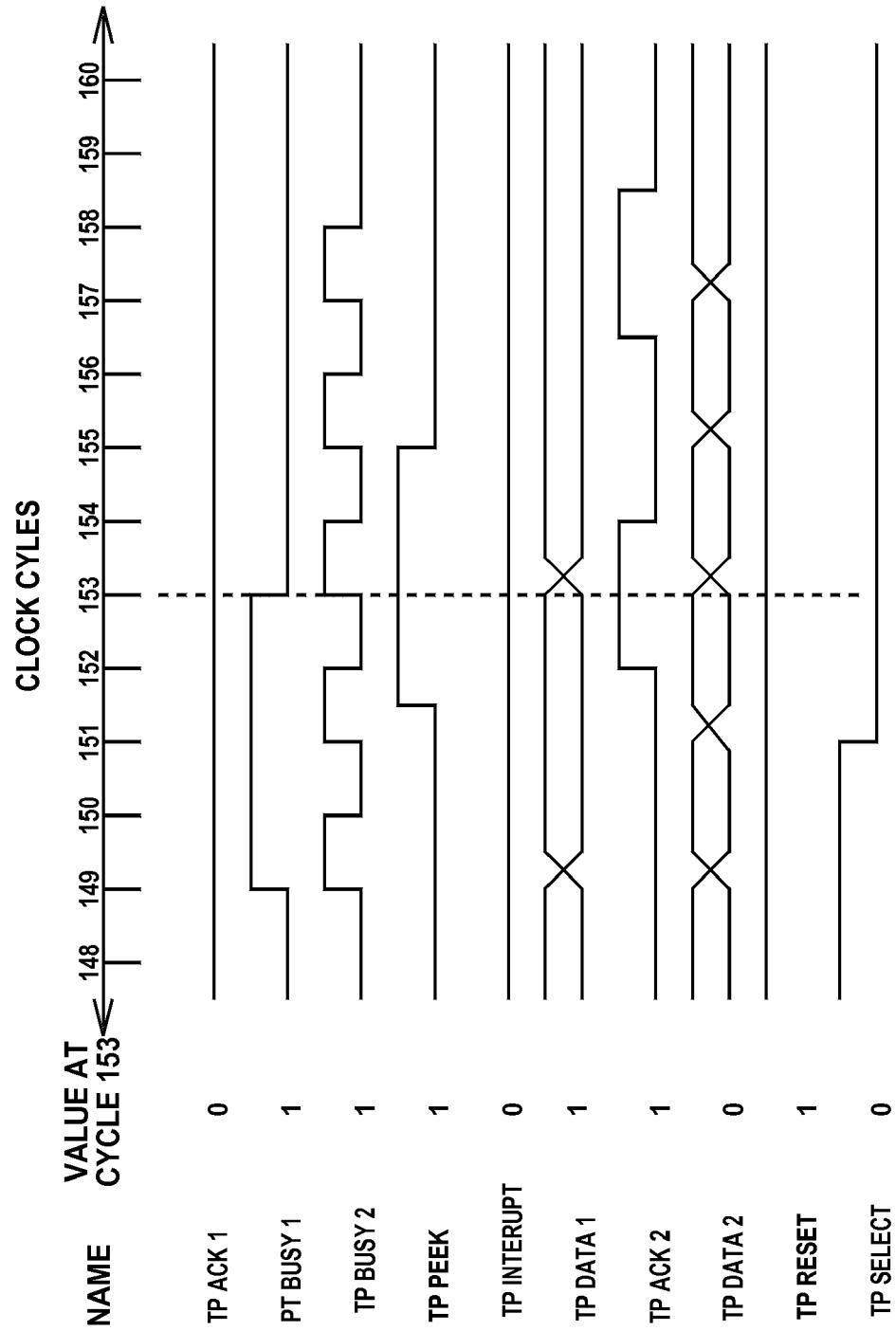
FIG. 4 is an exemplary chip faculty waveform generated by the embodiments of the present invention.

FIG. 4 is an exemplary chip faculty waveform generated by the embodiments of the present invention. In FIG. 4, a chip facility waveform includes a row for each selected state holding element, a first column of state holding element names, a second column of the value of the state holding element at a particular clock cycles, and a waveform section having a waveform for each state holding element extending over a number of clock cycles. Because there may be hundreds of clock cycles, when a chip facility waveform is displayed on display device such as a computer screen, the waveform section may be scrollable left and right and a cursor provided (dashed line) to select the values displayed in second column.

Figure 5:
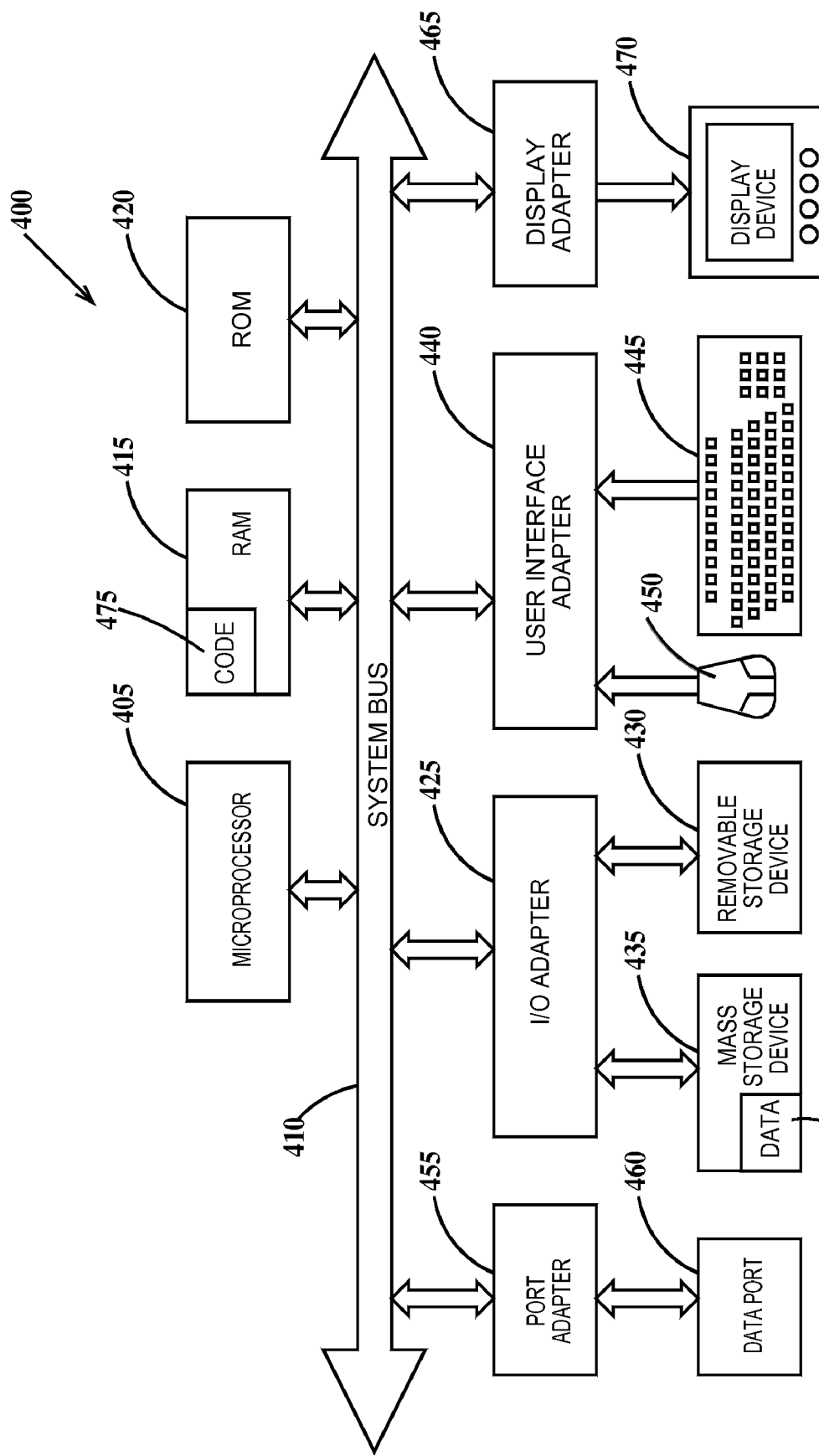
FIG. 5 is a schematic block diagram of a general-purpose computer portion of a tester for practicing the embodiments of the present invention.

FIG. 5 is a schematic block diagram of a computer portion of a tester for practicing the embodiments of the present invention. Generally, the method described herein with respect to a method for generating a chip facility waveform from a series of chip snapshots is practiced with a computer linked to or included in a test system and the methods described supra in the flow diagrams of FIGS. 2 and 3 may be coded as a set of instructions on removable or hard media for use by the computer.

In FIG. 5, computer 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470. The tester may be connected to computer system 400 through an additional port adapter 455.

ROM 420 contains the basic operating system for computer system 400. The operating system may alternatively reside in RAM 415 or elsewhere as is known in the art. Examples of removable data and/or program storage device 630 include magnetic media such as floppy drives and tape drives and optical media such as CD ROM drives. Examples of mass data and/or program storage device 435 include electronic, magnetic, optical, electromagnetic, infrared, and semiconductor devices. Examples of a computer-readable medium include a semiconductor or solid-state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

Thus the embodiments of the present invention provide a method and system for generating a chip facility waveform from a series of chip snapshots that allow enhanced determination of the origin of integrated circuit chip clockstops and subsequent chip fails.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method comprising:
   (a) selecting a set of state holding elements of an integrated circuit chip;
   (b) configuring a clockstop request delay to an initial number of clock cycles;
   (c) generating an error condition in said integrated circuit chip;
   (d) generating a clockstop request in response to said error condition;
   (e) delaying said clockstop request by a number of clock cycles equal to said clockstop request delay;
   after (e), (f) reading out a state of each state holding element of said set of state holding elements;
   after (f), (g) incrementing said clockstop request delay by a fixed number of clock cycles; and
   after (g), (h) repeating steps (c) through (f) a predetermined number of times or until an instruction to stop.

2. The method of claim 1, further comprising:
   between (e) and (g), storing said state of each state holding element of set of state holding elements and a current value of said clockstop request delay as a snapshot; and
   after (h), combining multiple snapshots having different clockstop request delays into a chip facility waveform.

3. The method of claim 1, wherein each time through (c) a same error condition is generated.

4. The method of claim 1, (c) further including:
   before said generating said error condition, configuring a trigger condition for said clockstop request.

5. The method of claim 1, wherein said error condition is generated by a trigger.

6. The method of claim 1, wherein said integrated circuit chip is a physical integrated circuit chip.

7. A test system including a computer comprising a processor, an address/data bus coupled to said processor, and a computer-readable memory unit coupled to communicate with said processor, said memory unit containing instructions that when executed by the processor implement a method for generating a chip facility waveform, said method comprising the computer implemented steps of:
   (a) selecting a set of state holding elements of an integrated circuit chip;
   (b) configuring a clockstop request delay to an initial number of clock cycles;
   (c) generating an error condition in said integrated circuit chip;
   (d) generating a clockstop request in response to said error condition;
   (e) delaying said clockstop request by a number of clock cycles equal to said clockstop request delay;
   after (e), (f) reading out a state of each state holding element of said set of state holding elements;
   after (f), (g) incrementing said clockstop request delay by a fixed number of clock cycles; and
   after (g), (h) repeating steps (c) through (f) a predetermined number of times or until an instruction to stop.

8. The test system of claim 7, the method further including the step of:
   between (e) and (g), storing said state of each state holding element of set of state holding elements and a current value of said clockstop request delay as a snapshot; and
   after (h), combining multiple snapshots having different clockstop request delays into said chip facility waveform.

9. The test system of claim 7, wherein each time through method step (c) a same error condition is generated.

10. The test system of claim 7, method step (c) further including:
    before said generating said error condition, configuring a trigger condition for said clockstop request.

11. The test system of claim 7, wherein in said method, said error condition is generated by a trigger.

12. The test system of claim 7, wherein said integrated circuit chip is a physical integrated circuit chip.

13. A method comprising:
    (a) selecting a set of state holding elements of an integrated circuit chip;
    (b) generating an error condition in said integrated circuit chip;
    (c) generating and executing a clockstop request in response to said error condition;
    after (c), (d) generating a snapshot of actual states of each of said state holding elements of said set of state holding elements;
    (e) determining next previous states of each state holding element of said set of state holding elements based on respective states of each state holding element of said set of state holding element of a last generated snapshot and based on a description of circuit elements of said integrated circuit chip and interconnections between said circuit elements;
    after (e), (f) generating a snapshot of said next previous states of each state holding element of said set of state holding elements; and
    after (f), (g) repeating steps (e) and (f) a predetermined number of times or until an instruction to stop.

14. The method of claim 13, further comprising:
    storing all snapshots and respective clock cycles of said snapshots.

15. The method of claim 13, further comprising:
    after (g), combining multiple snapshots into a chip facility waveform in a sequential clock cycle order.

16. The method of claim 13, (e) further including:
determining said next previous states of each state holding element of said set of state holding elements using a simulator running a computer model of said integrated circuit.

17. The method of claim 16, wherein said model is generated from a netlist and input to said model is states of each state holding element of said set of state holding elements from a last generated snapshot.

18. The method of claim 13, wherein said integrated circuit chip is a physical integrated circuit chip.

19. A test system including a computer comprising a processor, an address/data bus coupled to said processor, and a computer-readable memory unit coupled to communicate with said processor, said memory unit containing instructions that when executed by the processor implement a method for generating a chip facility waveform, said method comprising the computer implemented steps of:
(a) selecting a set of state holding elements of an integrated circuit chip;
(b) generating an error condition in said integrated circuit chip;
(c) generating and executing a clockstop request in response to said error condition;
after (c), (d) generating a snapshot of actual states of each of said state holding elements of said set of state holding elements;
(e) determining next previous states of each state holding element of said set of state holding elements based on respective states of each state holding element of said set of state holding element of a last generated snapshot and based on a description of circuit elements of said integrated circuit chip and interconnections between said circuit elements;
after (e), (f) generating a snapshot of said next previous states of each state holding element of said set of state holding elements; and
after (f), (g) repeating steps (e) and (f) a predetermined number of times or until an instruction to stop.

20. The test system of claim 19, the method further comprising:
storing all snapshots and respective clock cycles of said snapshots.

21. The test system of claim 19, the method further comprising:
after (f), combining multiple snapshots into a chip facility waveform in a sequential clock cycle order.

22. The test system of claim 19, method step (e) further including:
determining said next previous states of each state holding element of said set of state holding elements using a simulator running a computer model of said integrated circuit.

23. The test system of claim 22, wherein said model is generated from a netlist and input to said model is states of each state holding element of said set of state holding elements from a last generated snapshot.

24. The test system of claim 19, wherein said integrated circuit chip is a physical integrated circuit chip.

\* \* \* \* \*